US012777928B2

(12) United States Patent
Stegmeier et al.

(10) Patent No.: US 12,777,928 B2
(45) Date of Patent: Oct. 27, 2026

(54) ELECTRONICS ASSEMBLY COMPRISING CIRCUIT CARRIER, SEMICONDUCTOR CHIP AND HEAT SINK

(71) Applicant: Siemens Aktiengesellschaft, Munich (DE)

(72) Inventors: Stefan Stegmeier, Munich (DE); Heinz Wöllmer, Ammerthal (DE); Wolfgang Feil, Schwandorf (DE); Karl-Heinz Schaller, Ursensollen (DE); Stefan Kiefl, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 398 days.

(21) Appl. No.: 18/557,441

(22) PCT Filed: Apr. 19, 2022

(86) PCT No.: PCT/EP2022/060219
§ 371 (c)(1),
(2) Date: Oct. 26, 2023

(87) PCT Pub. No.: WO2022/228930
PCT Pub. Date: Nov. 3, 2022

(65) Prior Publication Data

US 2024/0379484 A1 Nov. 14, 2024

(30) Foreign Application Priority Data

Apr. 27, 2021 (EP) .................................... 21170578

(51) Int. Cl.
*H10W 40/22* (2026.01)
*H10W 40/20* (2026.01)
(Continued)

(52) U.S. Cl.
CPC ......... *H10W 40/22* (2026.01); *H10W 40/235* (2026.01); *H10W 40/242* (2026.01);
(Continued)

(58) Field of Classification Search
CPC ............. H10W 90/736; H10W 90/737; H10W 40/235; H10W 40/242
See application file for complete search history.

(56) References Cited

U.S. PATENT DOCUMENTS 6,075,288 A 6/2000 Akram .......................... 257/706
2015/0077941 A1 3/2015 Hosseini et al.
(Continued)

FOREIGN PATENT DOCUMENTS

DE 10 2015 216 047 2/2017
DE 10 2019 111 366 5/2020
(Continued)

OTHER PUBLICATIONS

Search Report for International Application No. PCT/EP2022/060219, 5 pages, Sep. 12, 2022.
(Continued)

*Primary Examiner* — Amar Movva
(74) *Attorney, Agent, or Firm* — Slayden Grubert Beard PLLC

(57) ABSTRACT

Various embodiments of the teachings herein include an electronics assembly comprising: a circuit carrier; a semiconductor chip mounted on the circuit carrier; and a heat sink. The circuit carrier and the semiconductor chip each have a planar basic shape extending along parallel principal planes. The heat sink is arranged in a first edge region of the parallel principle planes. The circuit carrier includes a thick-film conductor track defining a principal heat dissipation path between a first edge region of the semiconductor chip and the first edge region of the circuit carrier. The
(Continued)

thick-film conductor track is thermally coupled to the heat sink and has a layer thickness of at least 300 μm. The principal heat dissipation path runs parallel to the principal plane of the semiconductor chip to the heat sink in the first edge region. The semiconductor chip is bonded both electrically and also thermally to the conductor track.

14 Claims, 9 Drawing Sheets

(51) Int. Cl.
*H10W 72/00* (2026.01)
*H10W 90/00* (2026.01)

(52) U.S. Cl.
CPC .......... *H10W 72/00* (2026.01); *H10W 90/00* (2026.01); *H10W 90/736* (2026.01)

(56) References Cited

U.S. PATENT DOCUMENTS

2018/0174947 A1 6/2018 Mattmann ............ H01L 23/373
2022/0293489 A1 9/2022 Behrendt ............. H01L 23/473

FOREIGN PATENT DOCUMENTS

EP 1130643 A2 9/2001 ............ H01L 21/60
EP 2 555 407 2/2013
EP 3 751 602 12/2020

OTHER PUBLICATIONS

Chinese Office Action, Application No. 202280031228.X, 19 pages, Sep. 1, 2026.

ELECTRONICS ASSEMBLY COMPRISING CIRCUIT CARRIER, SEMICONDUCTOR CHIP AND HEAT SINK

CROSS-REFERENCE TO RELATED APPLICATIONS

This application is a U.S. National Stage Application of International Application No. PCT/EP2022/060219 filed Apr. 19, 2022, which designates the United States of America, and claims priority to EP application Ser. No. 21170578.5 filed Apr. 27, 2021, the contents of which are hereby incorporated by reference in their entirety.

TECHNICAL FIELD

The present disclosure relates to electronics assemblies. Various embodiments of the teachings herein include circuit carriers, semiconductor chips, and heat sinks, wherein the electronics assembly is intended for installation in a superordinate apparatus.

BACKGROUND

Numerous different electronics assemblies are known in which one or more semiconductor chips are arranged on a circuit carrier, and in which a heat sink is provided in order to dissipate the heat generated during operation. For the power electronics assemblies above all the effective dissipation of heat from the semiconductor chips represents a great challenge, because the power densities are becoming even greater and therefor ever more heat in an ever smaller space has to be dissipated reliably into the environment in order to avoid an overheating of the assemblies.

Power electronics assemblies are typically constructed in a horizontal series of layers. In more precise terms, a heat sink is connected over a wide surface area to a planar circuit carrier, and the circuit carrier in its turn is connected over an area on its opposite side to the semiconductor chips accommodated thereon. In this structure the principal surfaces of heat sink, circuit carrier and semiconductor chip accordingly lie in parallel with one another, and a principal dissipation path is produced that lies at right angles to these principal surfaces. One advantage of this conventional horizontal structure is that, through the surface bonding of semiconductor chip to circuit carrier and of circuit carrier to heat sink in each case, an effective heat transfer can be realized, and with a correspondingly small thickness and large surface of the circuit carrier an effective heat conduction through these is also produced. In this case a good dielectric strength can be achieved at the same time.

A disadvantage of this horizontal structure coupled over a large surface area according to the prior art is that such an electronics assembly, when installed in a superordinate apparatus, needs a relatively large amount of installation space within the installation plane. The reason for this is that the heat dissipation direction lies at right angles to the layer plane and the heat released must be dissipated in this direction to the external environment. The heat sink must thus be accessible to the external environment on its entire outer surface, in order for example to have a flow of cooling air flowing over it.

Therefore, with this type of structure, the minimum space requirement is typically dictated by the basic surface area of the heat sink or also the circuit carrier, depending on which of these elements has the larger basic surface area. Additional installation space is mostly still then needed for the load connections and control lines. In many applications however the overall installation space available is limited. For example in a switching cabinet there are only a limited number of plug-in locations of limited size in each case for the installation of such assemblies. It is precisely in apparatuses with power electronics assemblies that it is difficult to achieve a reliable dissipation of heat and despite this to keep the installation space small, since the power of such assemblies and this the heat released is becoming increasingly greater.

SUMMARY

The teachings of the present disclosure include electronics assemblies that address the said disadvantage. In some embodiments, an electronics assembly has a comparatively small space requirement within the installation plane of a superordinate apparatus and can still be cooled effectively. For example, some embodiments include an electronics assembly (1) with at least one circuit carrier (10*a*, 10*b*, 10*c*), at least one semiconductor chip (20*a*, 20*b*) and at least one heat sink (30), wherein the electronics assembly (1) has a planar basic shape with a principal plane (P), wherein the at least one circuit carrier (10*a*, 10*b*, 10*c*) is oriented in parallel with the principal plane (P) and carries one or more semiconductor chips (20*a*, 20*b*), with which it is connected in a planar fashion, wherein the at least one heat sink (30) is arranged in a first edge region (R1) of the planar electronics assembly (1), and wherein the at least one circuit carrier (10*a*, 10*b*, 10*c*) has at least one thick-film conductor track (11, 13, 16), which is part of a principal heat dissipation path (H), between the region of the at least one semiconductor chip (20*a*, 20*b*) and the first edge region (R1), wherein the at least one thick-film conductor track (11, 13, 16) is coupled thermally to the heat sink (30) and has a layer thickness of at least 300 μm, and wherein the principal heat dissipation path (H) runs in parallel with the principal plane P of the at least one semiconductor chip (20*a*, 20*b*) through to the heat sink (30) in the first edge region (R1) and wherein at least one semiconductor chip is bonded both electrically and also thermally to the thick-film conductor track (11, 13, 16).

In some embodiments, the electronics assembly (1) is embodied as a power electronics assembly and has at least one power electronics element as a semiconductor chip, in particular at least one power diode (21) and/or an IGBT (22).

In some embodiments, the electronics assembly (1) further comprises a number of semiconductor chips (21, 22) on the same circuit carrier (10*a*, 10*c*), which are arranged next to one another or behind one another with regard to the principal heat dissipation path (H).

In some embodiments, the thermal bonding of at least one thick-film conductor track (11, 13, 16) to the heat sink is facilitated by a large-area layer of insulation (12, 40).

In some embodiments, the at least one circuit carrier (10*a*, 10*c*) comprises a dielectric layer (12) made of an electrically insulating plastic.

In some embodiments, the at least one circuit carrier (10*a*, 10*b*, 10*c*) is formed by a metallic lead frame.

In some embodiments, the at least one semiconductor chip (21, 22) is connected on a first surface to a first circuit carrier (10*a*) in a planar fashion and on a second surface to a second circuit carrier or a metallic sheet (10*b*) in a planar fashion.

In some embodiments, the distance (d) between the first circuit carrier (10*a*) and the second circuit carrier or the metallic sheet (10*b*) amounts to at least 5 μm.

In some embodiments, the space between the first circuit carrier (10*a*) and the second circuit carrier or the metallic sheet (10*b*) and where necessary also the space between this and an optional third circuit carrier (10*c*) is filled with an electrically insulating filler.

In some embodiments, at least one internal circuit carrier (10*b*) is connected on each of its two main surfaces to one or more associated semiconductor chips (21, 22) in a planar fashion, so that a sandwich-like structure is produced.

In some embodiments, the at least one internal circuit carrier (10*b*) thickens in its cross section in the direction of the first edge area (R1) of the electronics assembly (1).

In some embodiments, the heat sink is divided into at least two mechanically separate part elements (31*a*, 31*b*).

In some embodiments, a space between the heat sink (30) and the at least one thick-film conductor track (11, 13, 16) is filled with a filler.

As another example, some embodiments include an apparatus with a base carrier (100) and at least one electronics assembly (1) as described herein, wherein an installation plane (G) is defined by the base carrier (100), of which a part area is embodied as an installation location (110) for the electronics assembly (1), wherein the electronics assembly (1) protrudes from the base carrier (100) so that the principal plane (P) of the electronics assembly (1) forms an angle of at least 30°, in particular of around 90°, with the installation plane (G) of the base carrier.

BRIEF DESCRIPTION OF THE DRAWINGS

The teachings of the present disclosure are described below with the aid of a few exemplary embodiments, which relate to the appended drawings, in which.

In the figures, elements that are the same or have the same function are provided with the same reference characters.

DETAILED DESCRIPTION

Figure 1:
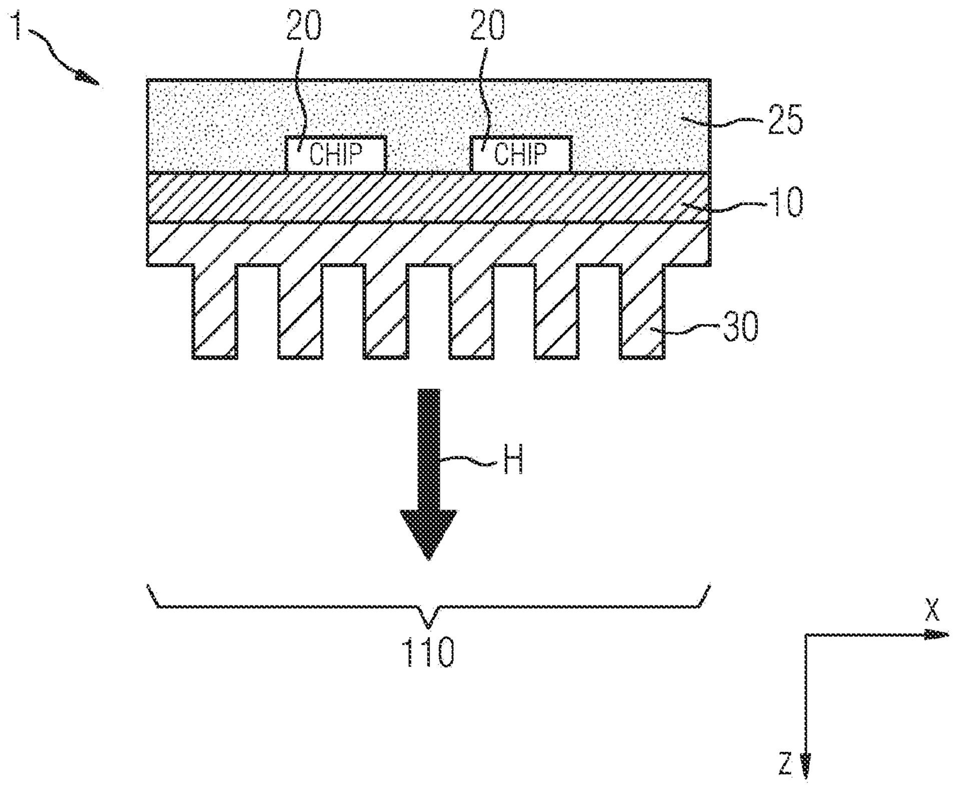
FIG 1 (Prior art)
FIG. 1 shows a schematic cross-sectional diagram of an electronics assembly according to the prior art.

An example electronics assembly incorporating teachings of the present disclosure includes a circuit carrier, at least one semiconductor chip, and at least one heat sink. It has a planar basic shape with a principal plane and is in particular intended for installation into a superordinate apparatus. The at least one circuit carrier is substantially oriented in parallel with the principal plane and carries one of more semiconductor chips, with which it is connected over its surface. The at least one heat sink is arranged in a first edge region of the planar electronics assembly. Between the area of the at least one semiconductor chip and the first edge region the at least one circuit carrier has at least one thick-film conductor track, which is part of a principal heat dissipation path, which runs substantially in parallel with the principal plane of the electronics assembly.

In some embodiments, the electronics assembly comprises a number of circuit carriers, in particular all circuit carriers present should be oriented in parallel with the principal plane. Also, the semiconductor chips connected to the surface of the respective circuit carrier are then oriented in parallel with this principal plane. Overall, a sandwich-like layer structure with one or more planar circuit carriers and one or more planar semiconductor chips is produced in this way. The at least one heat sink is arranged in this case in an edge region of this multilayer structure. The dissipation of heat to the external environment facilitated by the heat sink thereby predominantly takes place in this first edge region and not on the entire surface of the assembly. In this case it should not be excluded that parts of the heat sink extend over a larger part of the surface of the assembly. The subelements relevant for the dissipation of heat to the external environment (for example cooling ribs, cooling bars, cooling fins, cooling needles or comparable structures) should however be concentrated on the first edge region, so the predominant dissipation of heat to the environment occurs here.

In order to guide the heat to be dissipated by the heat sink to the environment into the area of the heat sink, the said principal heat dissipation path is embodied within the assembly. Of importance in connection with the present invention is that this principal heat dissipation path lies substantially in parallel with the principal plane of the assembly and not, as in the described prior art, at right angles to the layer structure. The said principal heat dissipation path can also be composed of a number of subpaths, in particular when the assembly has many semiconductor chips, from which the heat must be passed on to a common heat sink. The subpaths assigned to the respective semiconductor chips can then however flow into a common heat dissipation path. This common heat dissipation path runs predominantly within the principal plane of the assembly.

Furthermore, it should not be excluded in this connection that the individual subpaths (in the region next to the semiconductor chips) and also the common heat dissipation path of the local subsections formed therefrom have a heat flow direction that lies at right angles to the principal plane. The superordinate direction of the heat dissipation (i.e. the net transport direction for the dissipated heat) is characterized by one overall predominant direction component within the said principal plane. A small angle in the net transport direction and the principal plane of for example up to 10° should not be excluded in this case.

This direction of the principal heat dissipation path lying within the principal plane is achieved by the respective circuit carrier in the relevant area between a given semiconductor chip and the respective assigned heat sink having a thick-film conductor track. A thick-film conductor track should in this case generally be understood as a conductor track which has a layer thickness of at least 300 μm. The layer thickness in this case is the dimension of the conductor track at right angles to the principal plane. In particular such a layer thickness should be above 1 mm, for example in a range between 1 mm and 4 mm. This thick-film conductor track can in particular be formed from a metallic material, for example from copper, aluminum, molybdenum or an alloy comprising one or more of the said metals. In some embodiments, a copper-based thick-film conductor track may be useful.

In some embodiments, each of the semiconductor chips present is connected via such a thick-film conductor track to an assigned heat sink. A heat dissipation path is produced by this assigned thick-film conductor track, which connects the area of the respective semiconductor chip to the area of the assigned heat sink for heat conduction and lies in parallel with the principal plane (namely in the plane of the respective circuit carrier). Because of the particularly high layer thickness of this conductor track an effective heat transport is achieved in this way within the principal plane, so that the heat generated in the area of the semiconductor chip can be effectively transferred into the first edge region and can be dissipated there by the heat sink to the external environment.

In some embodiments, a number of such thick-film conductor tracks can be present in the assembly. These thick-film conductor tracks, as well as their function as a heat path, can moreover be used for an electrical bonding between the respective semiconductor chips. This is not absolutely necessary, however. In this way this theoretically possible double functionality can either be used for all or also for only a part of the thick-film conductor tracks present-depending on demand for electrical bonding. In some embodiments, at least one of the circuit carriers present fulfills a double function, in that both the electrical bonding and also the dissipation of heat from the associated semiconductor chip is realized by it.

As a result of the heat dissipation path lying within the principal plane, an installation in a superordinate apparatus is made possible in which the electronics assembly protrudes from a base carrier. In other words, the principal plane of the electronics assembly is then not, in contrast to the prior art, oriented in parallel with an installation plane of the apparatus, but extends away from the assigned installation location, in particular at right angles or at an angle. Through the heat dissipation path lying within the plane of the assembly an effective dissipation of heat is made possible in this arrangement, and this takes place by a heat sink, which in particular lies in an edge region of the assembly facing away from the installation location. Through this alignment protruding from the installation location of the assembly what is achieved on the one hand is that the installation location only uses up a relatively small area within the installation plane. On the other hand, the heat dissipation path created by the thick-film conductor track still guarantees an effective dissipation of heat to the external environment. Overall, very compact arrangements of one or more such assemblies in a superordinate apparatus can therefore be realized with the structures described herein, wherein high performance classes can still be employed.

In some embodiments, the apparatus has a base carrier and one or more electronics assemblies as described herein. An installation plane is defined by the base carrier, of which a subarea is embodied as an installation location for the respectively assigned electronics assembly. The respective electronics assembly protruding from the base carrier in this case in such a way that the principal plane of the electronics assembly makes an angle of at least 30° with the installation plane of the base carrier. In particular, the respective electronics assembly essentially protrudes at right angles from the base carrier. The features of the superordinate apparatus are produced in a similar way to the features of the assemblies already described.

The heat sink can in particular embody a heat dissipation surface that is oriented at an angle of at least 30° to the first principal surface. In some embodiments, this heat dissipation surface lies substantially at right angles to the principal plane of the assembly. This heat dissipation surface is not to be understood as a planar surface of the heat sink, but as an envelope, through which the flow of heat dissipated to the environment passes.

It is precisely in this area that it may advantageous for the heat sink not to be embodied flat but to have structures that increase its surface, such as for example cooling ribs, cooling bars, cooling fins, cooling needles or the like, in order to improve the dissipation of heat to the environment. For example, the heat sink can have a plurality of cooling ribs, which extend in particular in parallel with the principal plane of the assembly and in this way conduct the heat outwards even further in the direction of the principal heat dissipation path. In some embodiments, as an alternative to such parallel cooling ribs however the heat sink can also be embodied as a cooling star with angled and in particular also branched cooling structures.

In some embodiments, the electronics assembly can be embodied as a power electronics assembly. In this case the at least one of the semiconductor chips present is embodied as a power electronics assembly. In such a power assembly the advantages in relation to the small space requirement in the installation plane and the effective heat dissipation made possible despite this come into their own especially well. In this case for example a power diode and/or an IGBT (a bipolar transistor with an insulated gate electrode) can be used as the power electronics element, but also power elements basically known from the prior art.

In some embodiments, the electronics assembly can have a number of semiconductor chips that are arranged on the same circuit carrier. These semiconductor chips can be arranged next to one another or behind one another with regard to the principal heat dissipation path, wherein combinations of these two variants of the arrangement are also possible. The assigned thick-film conductor track enables a number of such semiconductor chips also to be connected to one another electrically if necessary. In this way for example a common emitter circuit between a power diode and an IGBT can be realized. As an alternative or in addition a number of elements can also be connected electrically to one another in the manner of a half bridge or a full bridge by one or more thick-film conductor tracks, wherein a common heat dissipation path is formed at the same time.

In some embodiments, the at least one thick-film conductor track is coupled thermally to the assigned heat sink. In particular this thermal coupling is designed so that the overall predominant heat dissipation path runs via the assigned thick-film conductor track between the respective semiconductor chip and the assigned heat sink.

In some embodiments, the thermal bonding of at least one of the thick-film conductor tracks present is transferred to the heat sink by a large-area insulation layer. "Large area" should be understood in this case as a layer of insulation that has a surface that is at least t as large as the surface of the associated thick-film conductor track. The surface of a thick-film conductor track in this case can generally for example lie above 1 $cm^2$, in particular in the range of at least 5 $cm^2$. The width of a thick-film conductor track can generally lie at 1 cm or more. With this dimensioning an especially effective heat transport to the heat sink may be provided.

When at least at any given point along the heat dissipation path there is a coupling via a large-area layer of insulation, then an electrical insulation between the heat sink and the thick-film conductor track (if necessary, also connected electrically to the semiconductor chip) can be brought about. Depending on the voltage class of the electronics assembly different layer thicknesses of the insulation layer are used. For example, the layer thickness can lie below 1 mm in this case, in particular in a range between 25 μm and 500 μm. With these types of layer thicknesses high dielectric strengths can be achieved. Because of the comparatively large surface in this case an effective thermal coupling can be achieved at the same time, despite the typically rather low thermal conductivity of electrically insulating materials. Suitable materials for such an electrically insulated coupling layer are generally organic polymers, in particular polyimides or epoxies that, if necessary, can also have filler materials made of other materials, in particular ceramic fillers, for setting a desired coefficient of thermal expansion.

In general, such a large-area layer of insulation can be arranged for example between a thick-film conductor track of a circuit carrier and a flat side element of a heat sink. In some embodiments, such a large-area layer of insulation can however also lie within a circuit carrier, in order to achieve an electrical decoupling between two thick-film conductor tracks lying above one another. Then one of these thick-film conductor tracks can be connected to the semiconductor chip and the other can be connected to the heat sink, wherein an electrical insulation between the heat sink and the semiconductor chip is achieved by the layer of insulation, but still with comparatively good thermal coupling as a result of the large surface and the small layer thickness of the layer of insulation.

In this way the at least one circuit carrier can comprise a plastic-based dielectric layer. In this case this can in particular involve an internal layer of a multilayer circuit carrier, which is surrounded in a sandwich-like manner by electrically conductive layers and in particular by thick-film conductor tracks. Such a circuit carrier with a polyimide-based dielectric layer is obtainable for example from the Dupont company under the name ODBC (for Organic Direct-Bond Copper substrate). Such organic thick copper substrates, by comparison with circuit carriers with ceramic dielectric layers, have the advantage that the organic layer can compensate much better for mechanical stresses as a result of the high conductor track thicknesses than a ceramic layer. This makes it possible to employ conductor tracks with the said high layer thicknesses, without it resulting in stress-related breaks or tears in the circuit carrier during operation. The dielectric layer does not exclusively have to consist of an organic plastic but can be based on such a material. This can in particular involve a composite material made of an organic polymer and one or more further components.

In some embodiments, the at least one circuit carrier can also be formed by a metallic lead frame. Here too this can once again involve a copper-based lead frame. A lead frame here is understood as what is known as a terminal frame, a solderable metallic line carrier in the form of a frame or comb. The structure of such a lead frame can in particular be created by punching or by laser processing. The lead frame can in particular have a planar bonding area for the respective semiconductor chip and a further planar bonding area for the further thermal bonding to the assigned heat sink. Here too in each case thick conductor tracks in the form of the individual bars are present that, as well as the electrical bonding, also bring about the dissipation of heat of the assigned semiconductor chips with a heat dissipation path within the assembly plane. For electrical insulation between the heat sink and the semiconductor chip such a lead frame can be provided at least in the area of the bonding point for the heat sink a corresponding electrically insulating layer.

Different embodiments are also possible for the structure of the individual layers of the electronics assembly and in particular for the number and order of the individual layers as well as the number of the sub elements contained therein. In some embodiments, the at least one semiconductor chip can be connected in a planar fashion on a first surface to a first circuit carrier and on a second, opposite surface to a second circuit carrier or in a planar fashion to a metallic sheet. In other words, the circuit carrier is then embedded in a sandwich-like manner between two thermally conductive structures, which each bring about a dissipation of heat with a principal heat dissipation direction within the assembly plane. With this form of embodiment an especially effective two-sided heat dissipation of the semiconductor chip is therefore achieved, wherein on both sides there is the further transport of the heat in parallel with the chip plane. Naturally a number of such semiconductor chips can also be embedded in such a way in a sandwich-like manner between two such heat-conducting elements.

In this form of embodiment with a sandwich-like embedding the distance between the first circuit carrier and the second circuit carrier or the metallic plate amounts to at least 5 μm. In some embodiments, this distance can lie in a range between 25 μm and 400 μm. This distance is high enough to guarantee a sufficiently high dielectric strength between the opposing metallic elements and low enough to make possible a sufficiently good two-sided thermal coupling of the semiconductor chip.

In some embodiments, the space between the first circuit carrier and the second circuit carrier or the metallic sheet is filled with an electrically insulating filler. This enables voltage flashovers to be avoided, and mechanical stresses between the individual elements can also be compensated for. In some embodiments, silicon-based materials, typically underfill materials and mold masses such as for example Globtop, can be employed as materials here. In some embodiments, such a polymer material can be filled in its turn with a filler in order to set a predetermined value for the coefficient of thermal expansion, and in this way to keep thermally induced stresses between the semiconductor chip and the circuit carriers or the metallic sheet small.

In some embodiments, at least one internal circuit carrier can be connected to each of its principal surfaces in a planar manner with one or more associated semiconductor chips. In this way a sandwich-like structure is also produced with regard to the internal circuit carriers. This form can be combined with the preceding one so that overall two planes of semiconductor chips are present, which are each cooled on both sides (by a common internal circuit carrier and a separate outer circuit carrier). This "Big Mac"-like structure made of overall at least five layers can in particular be constructed substantially symmetrical with regard to the inner circuit carrier.

In some embodiments, the internal circuit carrier thickens in the direction of the first edge region of the electronics assembly in its cross section. In this way the thermal bonding of the internal circuit carriers to the heat sink present there can be improved even further. In this way the internal circuit carrier can for example have a T-shaped profile, wherein the thermal bonding to the heat sink is realized in the area of the cross piece of the T-profile.

In some embodiments, the heat sink can be divided into at least two mechanically separate sub elements. The dividing line between these sub elements can in particular run centrally through the principal plane of the assembly. In particular with the sandwich-like layer structure described above each half of the sandwich can be assigned to a separate sub element of the heat sink. In this way thermally induced mechanical stresses in the area of the heat sink (or between this and the neighboring elements) can be effectively reduced.

In some embodiments, it is however also possible to divide up the heat sink so that a dividing line runs at right angles to the principal plane of the assembly. In particular the heat sink can thus be divided into a head element and a further element with two side parts, wherein the head element is arranged in the first edge region and the side parts extend in parallel with the principal plane and envelop the principal elements of the layer structure to a certain extent.

In general and depending on the precise structure and the heat sink, a space between the heat sink and the at least one thick-film conductor track can also be filled with a filler. In some embodiments, further measures for mechanical decoupling can also be employed within the assembly, for example by metal foam as a filler, by springs between the individual elements and also by branching between the individual thick-film conductor tracks or the embodiment of a stack, in which the total thickness of a thick-film conductor track is composed of a number of part layers.

In some embodiments, the base carrier can run in parallel with the rear wall of a switching cabinet or be formed by this rear wall itself. Accordingly, the apparatus can involve a switching apparatus and/or a control apparatus, which in particular can be designed for controlling an electric drive. For example, a control apparatus for an industrial application, in particular for an industrial production plant, can be involved, which has one or more inventive electronics assemblies. The individual electronics assemblies can at least in part preferably involve power modules, which are intended for modular installation into the installation plane of the apparatus, for example converter modules. To this end the respective electronics assembly can have corresponding connection elements, for example plug pins for plugging into a mounting location on the base carrier. In addition to the elements already described the superordinate apparatus can optionally also have a cooling apparatus, a housing and/or one or more busbars.

FIG. 1 depicts a schematic sectional diagram of an electronics assembly according to the prior art, which is typical of the basic structure of conventional power electronics assemblies.

Two semiconductor chips 20 are connected in a planar manner to a circuit carrier 10 and molded on their outer side with a molding medium 25. The circuit carrier 10 is connected on its opposite principal surface to a heat sink 30, which has cooling ribs for dissipation of heat to the external environment. Through this, a planar electronics assembly 1 is produced overall, of which the principal plane lies here within the xy plane. The direction of the principal heat dissipation path H lies at right angles to this plane, i.e. in the z direction.

In order to guarantee a dissipation of heat to a side lying outside such an assembly according to the prior art is installed in a planar manner into an installation location 110 of a superordinate apparatus. In other words, the installation plane then lies within the xy plane, and the principal heat dissipation path H is oriented substantially at right angles to the installation plane. Through this a relatively large lateral space requirement for the installation location 110 is produced in the xy plane. The size of the installation location needed is typically even greater still than the lateral dimension of the elements shown here, because mostly more additional space must be provided within the xy plane for the load connections and control lines not shown here for the sake of clarity. Overall, such an electronics module structured horizontally needs a very great deal of space within the installation plane of a superordinate apparatus.

Figure 2:
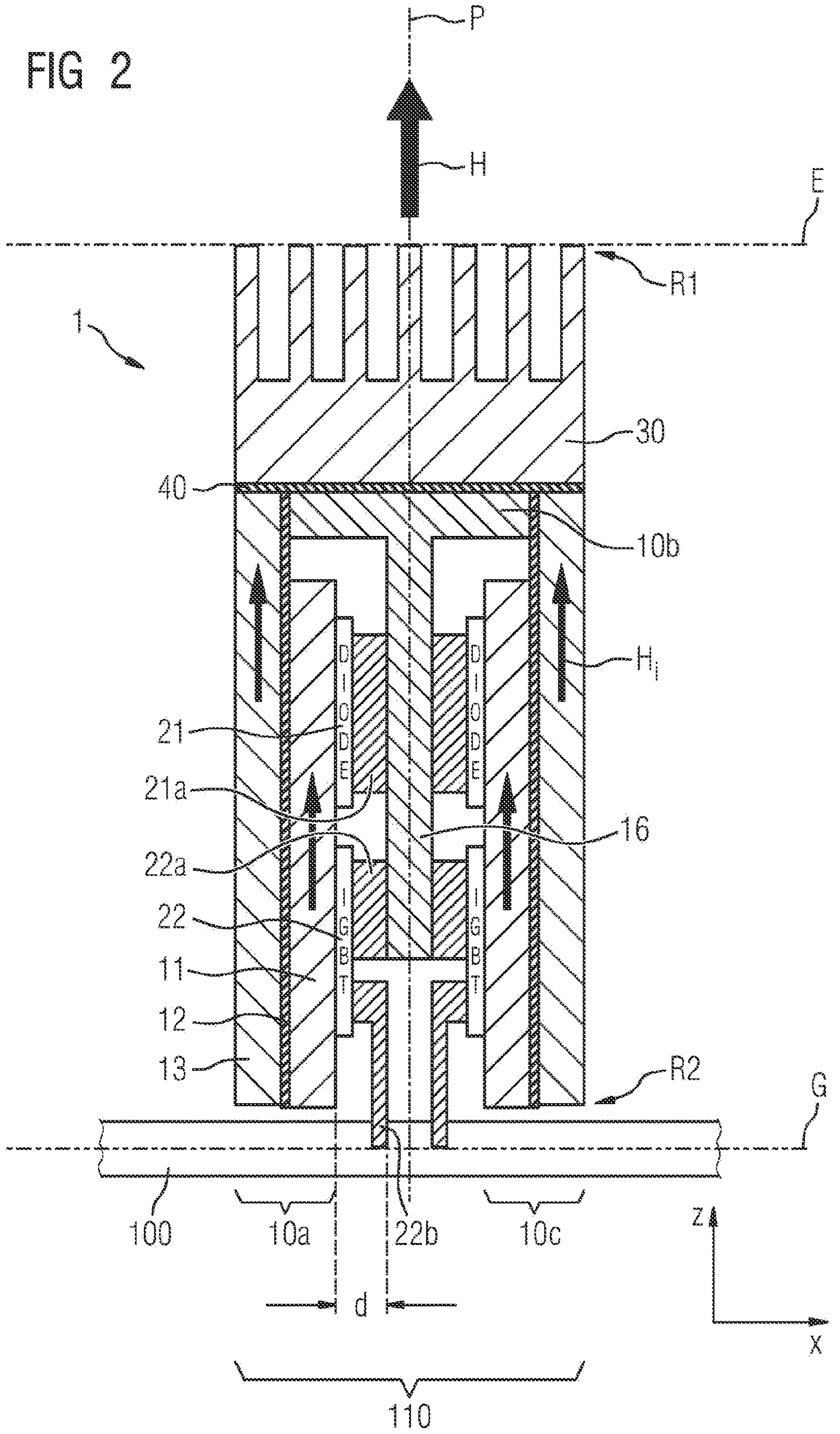
FIG. 2 shows an electronics assembly incorporating teachings of the present disclosure in a schematic longitudinal section.

FIG. 2 is an example electronics assembly 1 incorporating teachings of the present disclosure. A schematic longitudinal section is shown, which runs at right angles to a principal plane P of the electronics assembly embodied overall in a planar fashion. The electronics assembly shown comprises circuit carriers 10*a*, 10*b* and 10*c*, which each lie with their principal surfaces in parallel with the principal plane P. They lie above one another in a sandwich-like manner.

The two outer circuit carriers 10*a* and 10*c* are each equipped with two semiconductor chips, namely in this example with a power diode 21 and an IGBT 22 in each case. The two outer circuit carriers 10*a* and 10*c* are formed in this example from multilayer thick copper substrates. They thus have thick-film conductor tracks 11 and 13 made of copper, wherein in principle other metallic materials can also be used for the thick-film conductor tracks. The thicknesses of the individual conductor tracks in the x direction can in this case amount in particular to at least 1 mm.

Each of the two circuit carriers 10*a* and 10*c* in this example has an inner 11 and an outer thick-film layer 13 and between them an organic dielectric layer 12. The circuit carrier structure can overall be embodied similarly to the so-called ODBC substrates by Dupont. The two semiconductor chips 21, 22 on each circuit carrier 10*a* or 10*c* are thus arranged on an internal thick-film conductor track 11 and connected to said track for example by soldering, sintering, diffusion soldering or gluing. Through this on the one hand an electrical contact is established and on the other hand a thermal bonding is made. In the example shown the power diode 21 and the associated IGBT 22 are connected by the respective inner thick-film conductor track 11 in the manner of a common-emitter circuit.

The other contacts of the IGBT are connected to associated terminal elements 22*b*, of which in the y direction not shown here, two are arranged behind one another in each case and which can be embodied as pins in a superordinate apparatus. The second contact of the respective power diode 21 is connected via a connecting element 21*a* to a central thick-film conductor track 16 of the internal second circuit carrier 10*b*. The IGBTs 22 are also coupled via associated connecting elements 22*a* to the central thick-film conductor track 16.

In this way all four semiconductor chips 20, 21 are coupled thermally to the thick-film conductor tracks 11 and 16 running in parallel with the principal plane P. The inner thick-film conductor tracks 11 are in their turn coupled thermally via the thin dielectric layer of the respective circuit carriers to the respective outer thick-film conductor track 13. In this way the good thermal conductivity enables a heat transport to be achieved in the z direction, and the waste heat generated during the operation of the semiconductor chips can be dissipated in the direction of the first edge region R1 of the assembly.

A heat sink 30 is arranged in this first edge region R1. This heat sink has a plurality of cooling ribs for example, which can likewise run in parallel with the principal plane. The (enveloping) outer surface of the heat sink represents a heat dissipation surface E, through which a principal heat dissipation path H for the dissipation of heat to the outer environment passes. Overall, this principal heat dissipation path lies substantially in parallel with the principal plane P of the assembly. This is achieved by the heat being transported by the thick-film conductor tracks 11, 13 and 16 in the z direction from the regions of the respective semiconductor chips through to the heat sink.

Thus, a number of subpaths $H_i$ are produced, which run within the individual thick-film tracks and in each case substantially in the z direction. Thus, a net heat dissipation in parallel with the principal plane is produced. In this case it should not be excluded however that a passage of heat also takes place locally in the x direction, for example when the heat is dissipated from the respective semiconductor chip 21, 22 into the neighboring thick-film conductor track 11 or 16 or when it is forwarded from the inner thick-film conductor track 11 via the dielectric layer 12 into the neighboring outer thick-film conductor track 13.

The net heat dissipation direction H runs in parallel with the principal plane P. What is achieved by thus is that the electronics assembly can be installed on edge, i.e. with a bond in its narrow second edge region R2 into a superordinate apparatus. A part of a base carrier 100 is only shown extremely schematically in FIG. 2, with this being part of superordinate apparatus and having an installation location 110 for the assembly 1. What is achieved by the on-edge arrangement is that the installation location 110 within the installation plane G running in the xy plane only needs a relatively small lateral surface. Despite this a transport of heat away from the base body and thus an effective heat dissipation to the external environment is achieved by the heat dissipation in the z direction described, which is facilitated via the thick-film conductor tracks. The connection to the base carrier 100 can be achieved for example by plugging in the pins 22*b*.

In the example of FIG. 2, a number of semiconductor chips 21, 22 are embedded in the manner of a multilayer sandwich between a total of three circuit carriers 10*a*, 10*b*, 10*c*. This is not absolutely necessary however. At least for one semiconductor chip with at least one thick-film conductor track of an associated circuit carrier, a transport of heat in parallel with the assembly plane and thus away from the installation location 110 in the superordinate apparatus is achieved.

The sandwich-like structure in the example of FIG. 2 allows the individual semiconductor chips can be cooled even more effectively by their two-sided coupling to the neighboring thick-film conductor tracks 11, 16. In this case the distance d between these opposing thick-film conductor tracks 11 and 16 amounts to at least 10 μm, so that voltage flashovers are avoided. In some embodiments, the space formed can optionally be filled with an electrically insulating filler.

Figure 3:
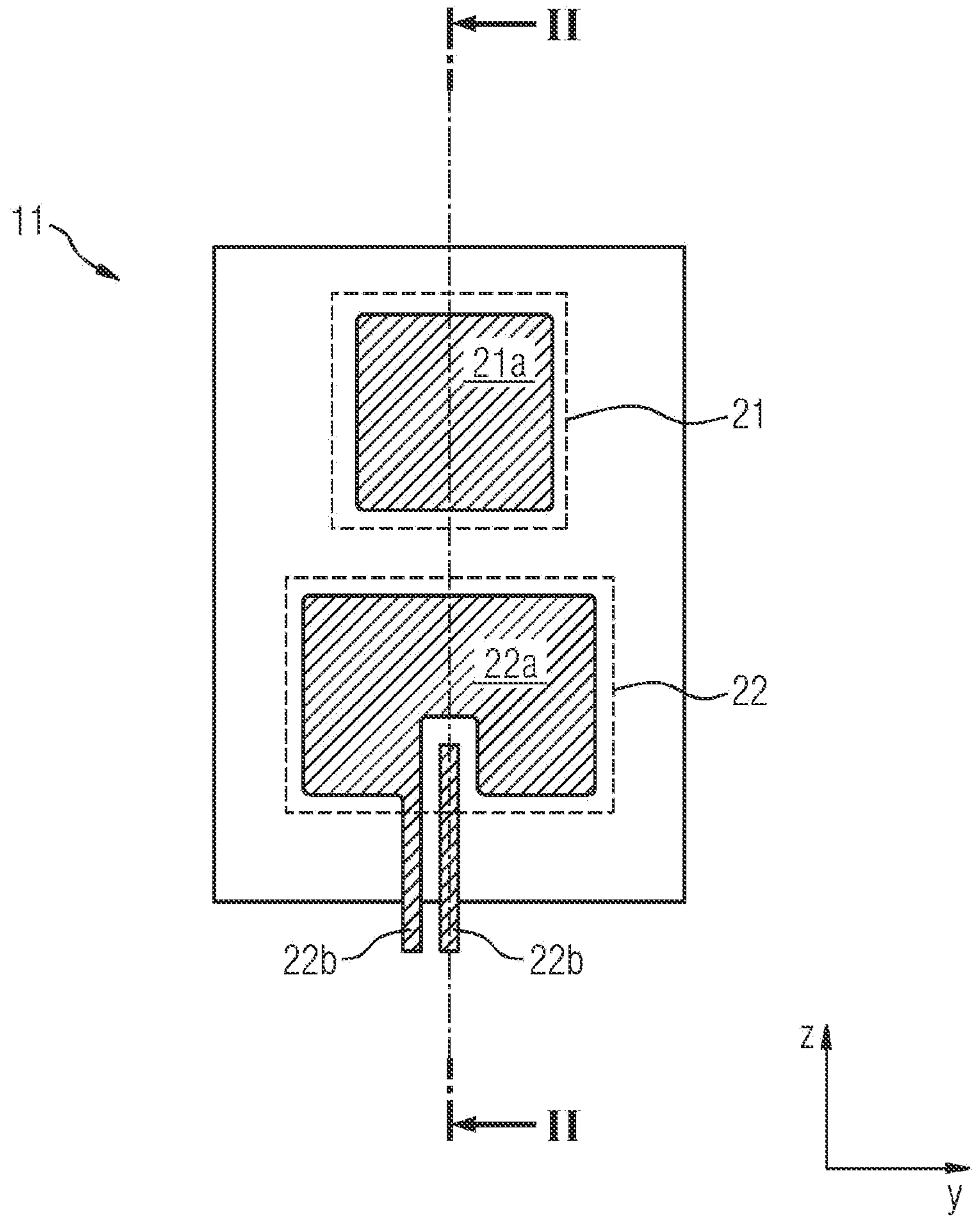
FIG. 3 shows n overhead view of an inner thick-film conductor track of FIG. 2.

Shown in FIG. 3, is one of the inner thick-film conductor tracks 11 from the example of FIG. 2 with the power diode 21 and the IGBT 22 arranged thereon, in a schematic overhead view. Moreover, the location of the associated connecting elements 21*a*, 22*a* for bonding to the central thick-film conductor track and the additional terminal elements 22*b* of t the IGBT are indicated. The cut line II-II in this case corresponds to the position of the cross section of FIG. 2. In this example the two semiconductor chips 21, 22 are arranged next to one another in the z direction, so that they lie behind one another with regard to the principal heat dissipation path.

The arrangement of these two semiconductor chips on the common circuit carrier 10*a* is only to be understood as an example. Other topologies and circuit arrangements of other types and numbers of chips can also be used, wherein a number of chips can also be stacked, and additional conductor tracks can be present, in order to achieve a low-induction structure. In some embodiments, an electrical through contacting through the semiconductor material in the form of vias can also be present in order to make the electrical bonding of the chips easier.

Figure 4:
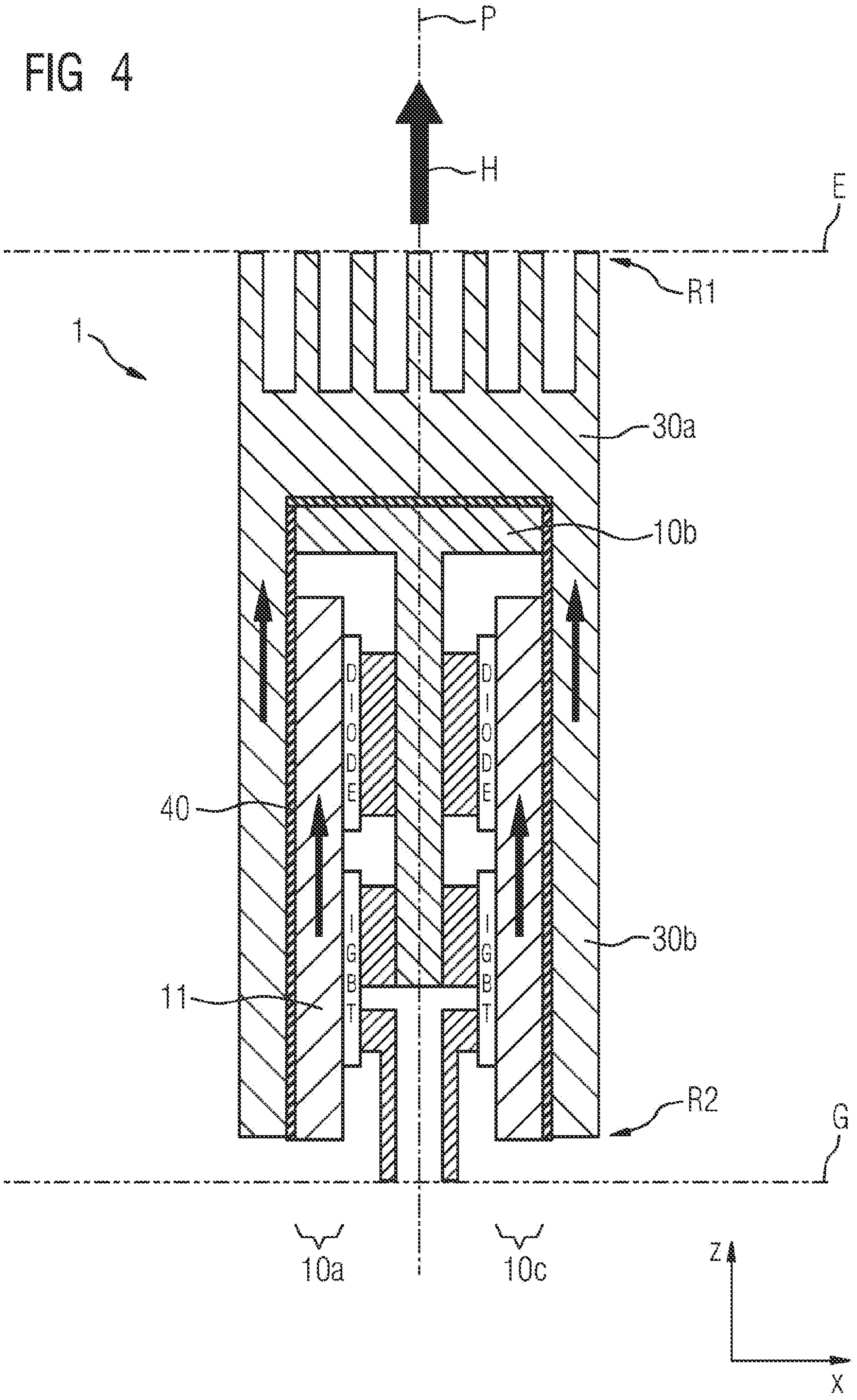
FIGS. 4 and 5 show schematic longitudinal sections of electronics assemblies incorporating teachings of the present disclosure.

FIG. 4 shows an electronics assembly 1 according to a further example of the invention in a schematic longitudinal section. The basic arrangement of the semiconductor chips 21, 22 and their embedding between a total of three circuit carriers 10*a*, 10*b*, 10*c* is similar to that of the example of FIG. 2. Unlike this example, the two outer circuit carriers 10*a* and 10*c* are substantially formed here by the material of the thick-film conductor tracks 11. They can thus for example be embodied as copper lead frames.

Instead of the outer thick-film conductor tracks from FIG. 2 the heat sink here, in addition to the head part 30*a* largely carried over from FIG. 2, also has two planar side parts 30*b*, which extend in parallel with the thick-film conductor tracks 11. The transport of heat between the thick-film conductor tracks 11 and the side parts 30*b* of the heat sink is facilitated here by a layer of insulation 40, so that the heat sink is electrically insulated from the conductor tracks. As a result of the large surface and the small layer thickness of the layers of insulation 40, a good thermal bonding to the side elements of the heat sink and thus once again an effective principal heat dissipation path H in parallel with the principal plane P of the assembly is achieved.

Figure 5:
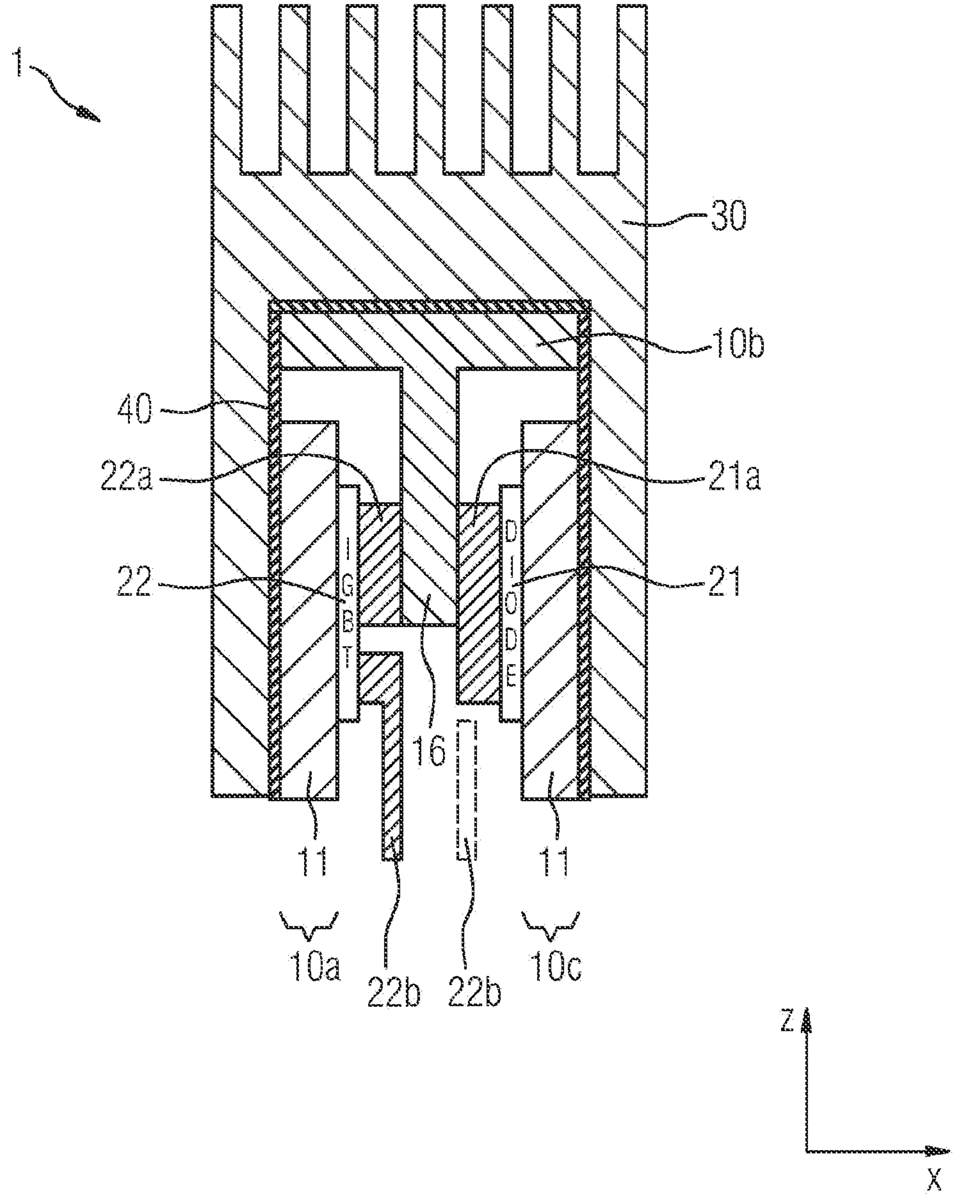
Figure 6:
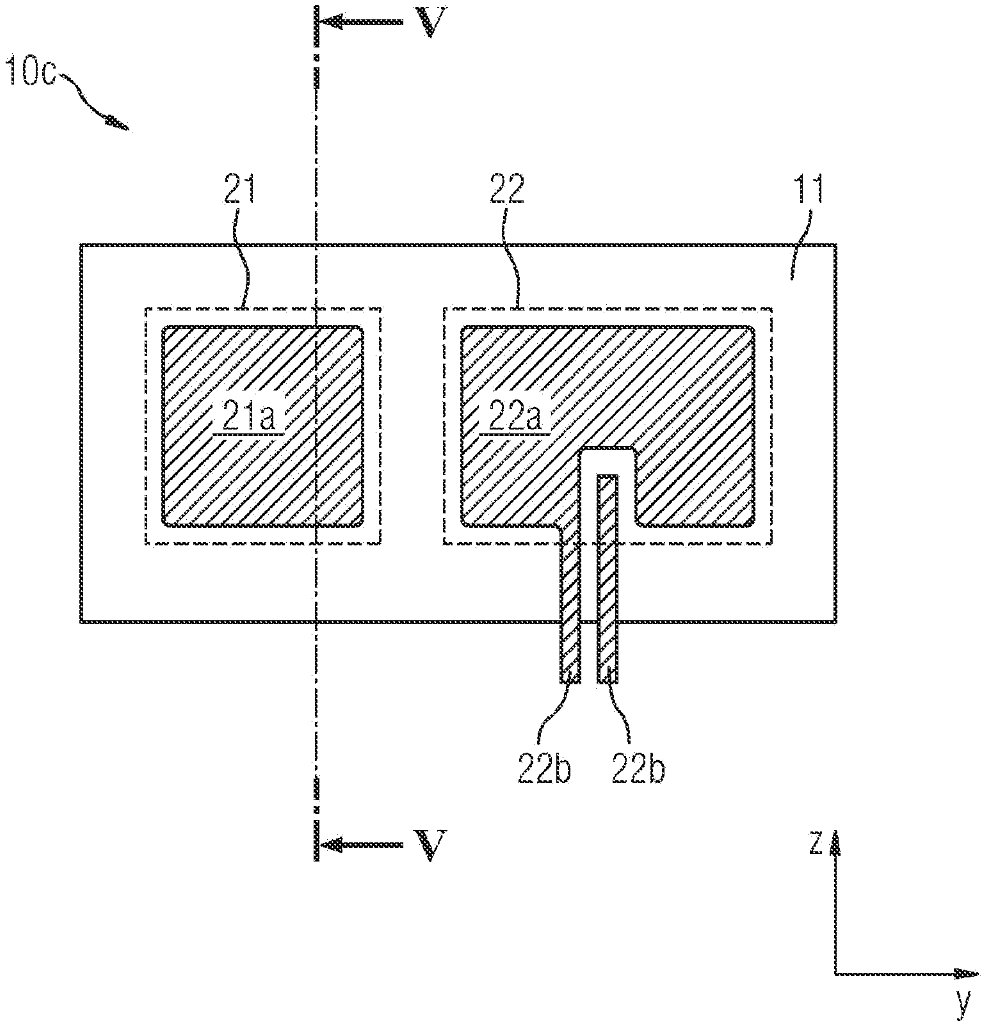
FIG. 6 shows an overhead view of the third circuit carrier of FIG. 5.

FIG. 5 shows an example electronics assembly 1 incorporating teachings of the present disclosure in a schematic longitudinal section. The layer structure of the assembly and also the structure of the heat sinks are similar to those shown in the preceding example of FIG. 4. Here too each of the two circuit carriers 10*a* and 10*c* is equipped with a power diode 21 and an IGBT 22, wherein however these two elements are arranged here next to one another in the y direction not shown, so that in the sectional diagram of FIG. 5 only one element is visible per circuit carrier in each case. The overhead view of FIG. 6 illustrates how, on the respective circuit carrier (here for example the third circuit carrier 10*c*) the two elements 21 and 22 are arranged next to one another as regards the main heat dissipation direction z.

Figure 7:
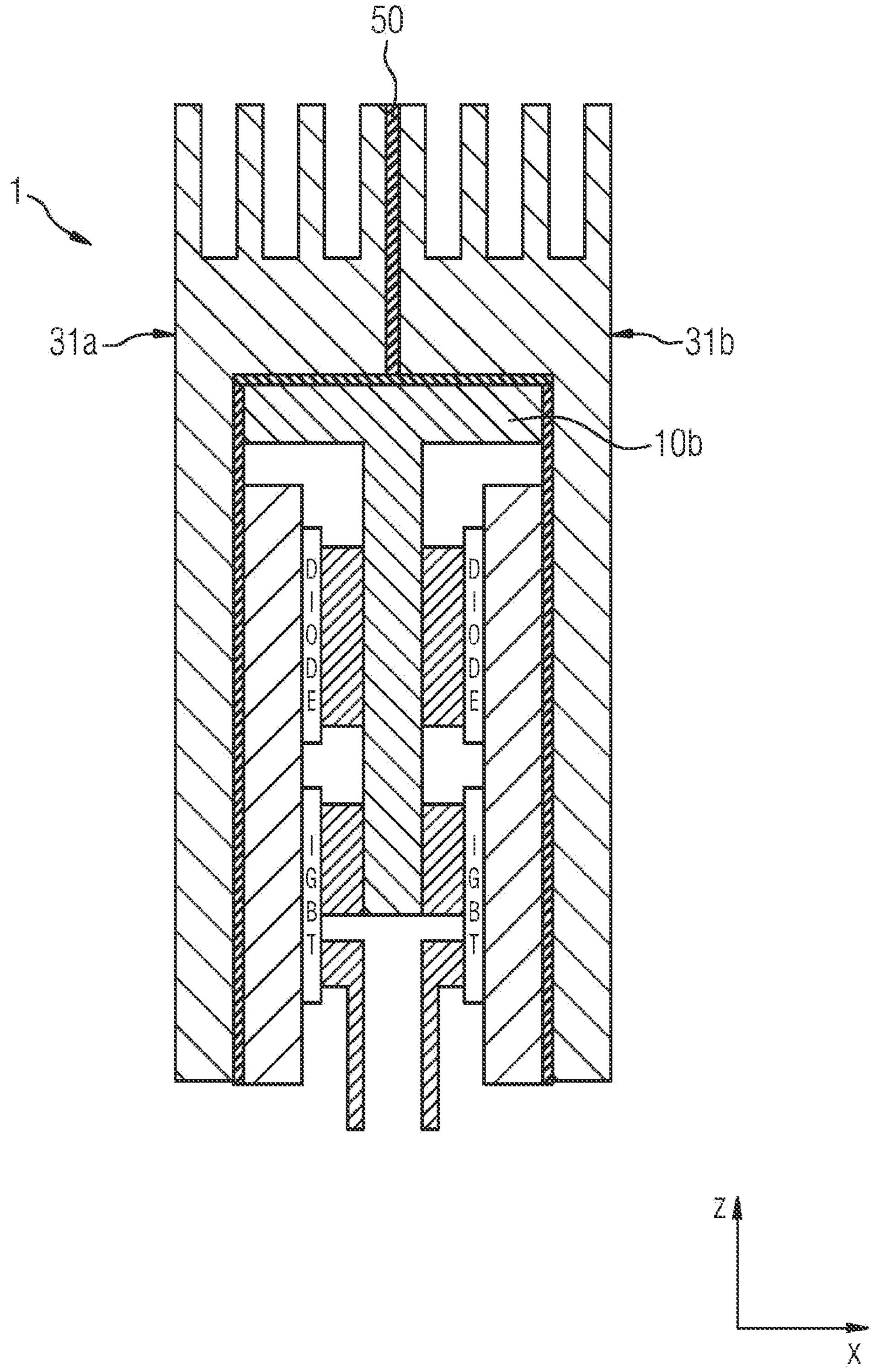
FIGS. 7 to 9 show further variants for the structure of the heat sink in such electronics assemblies.

FIG. 7 shows an example electronics assembly 1 incorporating teachings of the present disclosure in a schematic longitudinal section. In this example, the structure is largely similar to that of the example of FIG. 4. The major difference from said example is that the heat sink is composed here of two part elements 31*a* and 31*b*. The connection between the two part elements is made via a coupling layer 50, which lies in the yz plane and is suitable for reducing thermally induced mechanical stresses between the two part elements.

Figure 8:
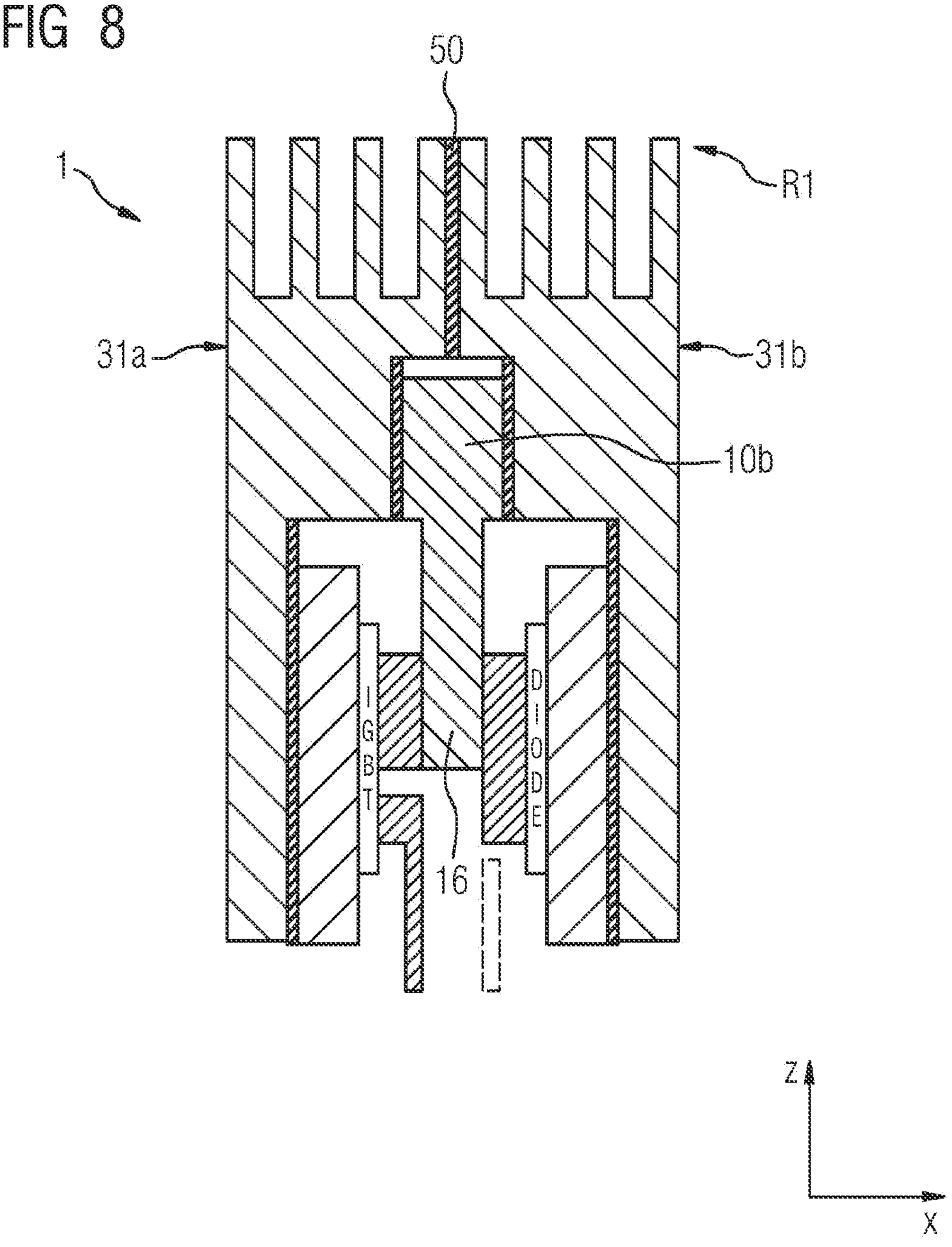

FIG. 8 shows an example electronics assembly 1 incorporating teachings of the present disclosure in a schematic longitudinal section. In this example, the structure is largely similar to that shown in the examples of FIGS. 5 and 6. The major difference is that here too—similarly to the example shown in FIG. 7—the heat sink is composed of two part elements 31*a* and 31*b*. Unlike in the example of FIG. 7 the internal second circuit carrier here is not so greatly widened into a T shape in the direction of the head part of the heat sink but is only slightly thickened here towards the edge region R1. In order to achieve a good thermal coupling to the central thick-film conductor track 16, the two part elements of the heat sink therefore have an additional step in this region.

Figure 9:
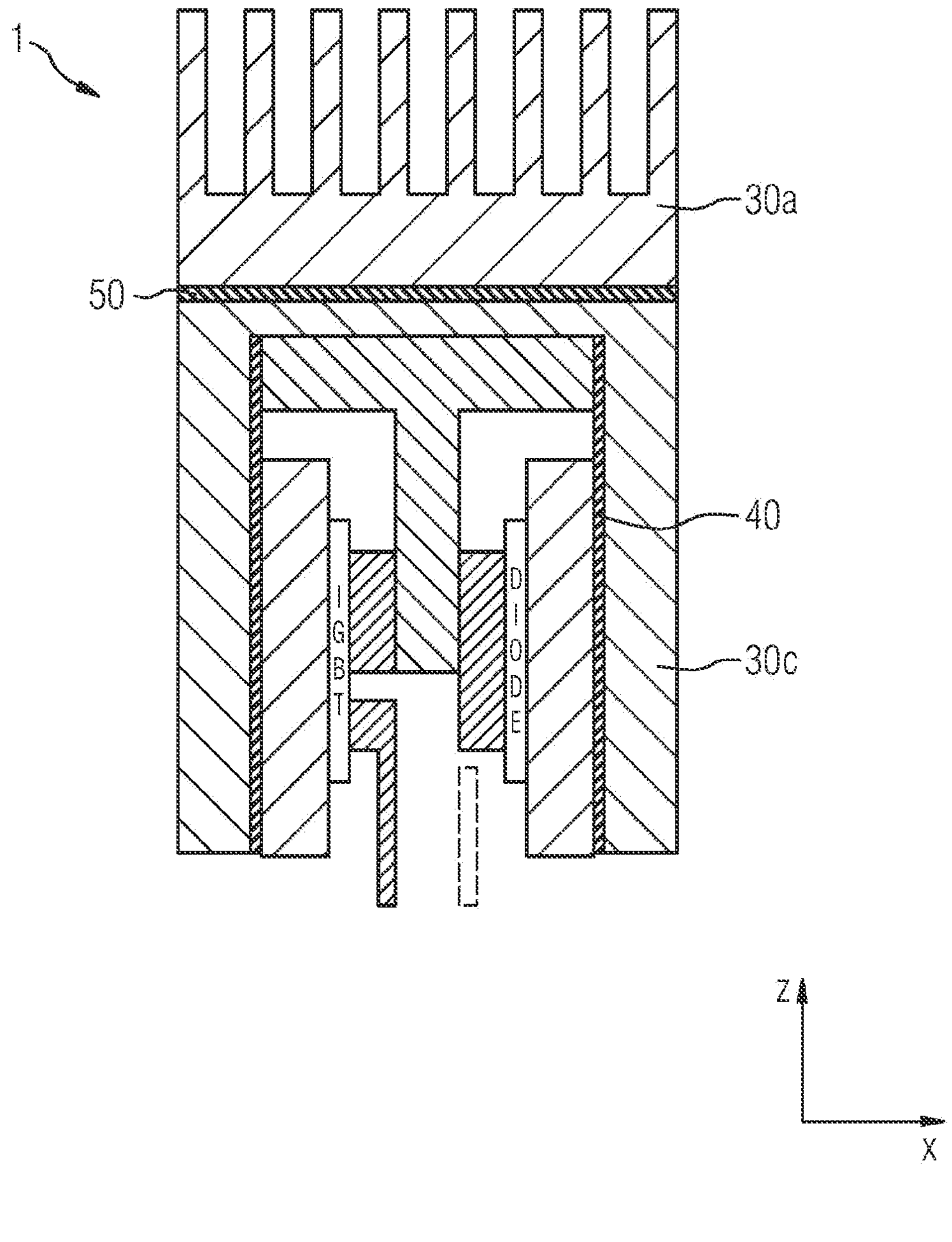

FIG. 9 shows an example electronics assembly 1 incorporating teachings of the present disclosure in a schematic longitudinal section. Here too the structure is largely similar to that shown in the examples of FIGS. 5 and 6. Here the structure of the heat sink is varied in the way that an additional division into a head part 30*a* and a part element 30*c* separate therefrom is present, wherein the part element 30*c* has a U-shaped cross-sectional profile and envelops the other elements of the slice structure. The thermally conductive connection between the part element 30*c* and the head part 30*a* of the heat sink is realized here by a coupling layer 50 made of a heat-conduction paste. The planar side parts are connected by a layer of insulation 40 to the neighboring thick-film conductor tracks. This type of division of the heat sink can also contribute to reducing thermally induced mechanical stresses within the electronics assembly 1.

The different embodiment variants shown for the arrangement of the semiconductor chips, the structure of the individual circuit carrier and the structure of the heat sink can naturally be combined with one another, and the invention is not restricted to the exemplary embodiments shown. All examples illustrate the general concept of how, by creating an effective heat dissipation path within the assembly plane, a space-saving edgewise installation in a compact installation location of a superordinate apparatus is made possible.

LIST OF REFERENCE CHARACTERS

1 Electronics assembly
10 Circuit carrier
10*a* First circuit carrier
10*b* Second circuit carrier or metallic sheet
10*c* Third circuit carrier
11 Inner thick-film conductor track
12 Organic dielectric layer
13 Outer thick-film conductor track
16 Central thick-film conductor track
20 Semiconductor chip
21 Power diode
21*a* Connecting element
22 IGBT
22*a* Connecting element
22*b* Terminal elements (pins)
25 Molding means
30 Heat sink
30*a* Head part
30*b* Planar side part
30*c* U-shaped part element
31*a* First part element
31*b* Second part element
40 Layer of insulation
50 Coupling layer
100 Base carrier
110 Installation location
d Distance
E Heat dissipation plane
G Installation plane
H Principal heat dissipation path
$H_i$ Subpaths
P Principal plane of the electronics assembly
R1 First edge region of the electronics assembly
R2 Second edge region
X, Y, z Cartesian coordinates

What is claimed is:

1. An electronics assembly comprising:
a circuit carrier;
a semiconductor chip mounted on the circuit carrier; and
a heat sink;
wherein the circuit carrier and the semiconductor chip each have a planar basic shape extending along parallel principal planes;
wherein the heat sink is arranged in a first edge region of the parallel principle planes;
and
the circuit carrier includes a thick-film conductor track defining a principal heat dissipation path between a first edge region of the semiconductor chip and the first edge region of the circuit carrier;
the thick-film conductor track is thermally coupled to the heat sink and has a layer thickness of at least 300 μm;
the principal heat dissipation path runs parallel to the principal plane of the semiconductor chip to the heat sink in the first edge region; and
the semiconductor chip is bonded both electrically and also thermally to the thick-film conductor track.

2. The electronics assembly as claimed in claim 1, wherein the semiconductor chip includes a power electronics element.

3. The electronics assembly as claimed in one of claim 1, further comprising additional semiconductor chips arranged next to one another or behind one another on the circuit carrier with regard to the principal heat dissipation path.

4. The electronics assembly as claimed in claim 1, further comprising a large-area layer of insulation providing thermal bonding of the thick-film conductor track to the heat sink.

5. The electronics assembly as claimed in claim 1, wherein the circuit carrier comprises a dielectric layer made of an electrically insulating plastic.

6. The electronics assembly as claimed in claim 1, wherein the circuit carrier comprises a metallic lead frame.

7. The electronics assembly as claimed in claim 1, wherein the semiconductor chip is connected on a first surface to the circuit carrier in a planar fashion and on a second surface to a second circuit carrier or a metallic sheet in a planar fashion.

8. The electronics assembly as claimed in claim 7, wherein a distance between the circuit carrier and the second circuit carrier amounts to at least 5 μm.

9. The electronics assembly as claimed in claim 7, wherein a space defined between the circuit carrier and the second circuit carrier is filled with an electrically insulating filler.

10. The electronics assembly as claimed in claim 1, wherein the circuit carrier is connected on each of two main surfaces to one or more associated semiconductor chips in a planar fashion, so that a sandwich-like structure is produced.

11. The electronics assembly as claimed in claim 10, wherein the circuit carrier thickens in its cross section in the direction of the first edge area of the electronics assembly.

12. The electronics assembly as claimed in claim 1, wherein the heat sink is divided into at least two mechanically separate part elements.

13. The electronics assembly as claimed in claim 1, wherein a space between the heat sink and the thick-film conductor track is filled with a filler.

14. An apparatus comprising:
a base carrier;
a circuit carrier;
a semiconductor chip mounted on the circuit carrier; and
a heat sink;
wherein the circuit carrier and the semiconductor chip each have a planar basic shape extending along parallel principal planes;
wherein the heat sink is arranged in a first edge region of the parallel principle planes; and
the circuit carrier includes a thick-film conductor track defining a principal heat dissipation path between a first edge region of the semiconductor chip and the first edge region of the circuit carrier;
the thick-film conductor track is thermally coupled to the heat sink and has a layer thickness of at least 300 μm;

the principal heat dissipation path runs parallel to the principal plane of the semiconductor chip to the heat sink in the first edge region; and the semiconductor chip is bonded both electrically and also thermally to the thick-film conductor track;

an installation plane is defined by the base carrier, of which a part area is embodied as an installation location for the electronics assembly;

the electronics assembly protrudes from the base carrier so that the principal plane forms an angle of at least 30° with the installation plane of the base carrier.

* * * * *